United States Patent
Ishikawa et al.

(10) Patent No.: US 6,937,070 B2
(45) Date of Patent: Aug. 30, 2005

(54) AMPLITUDE-DETECTING METHOD AND CIRCUIT

(75) Inventors: Nobuhiro Ishikawa, Tsukuba (JP); Kiyokazu Okamoto, Tsukuba (JP)

(73) Assignee: Mitutoyo Corporation, Kawasaki (JP)

( * ) Notice: Subject to any disclaimer, the term of this patent is extended or adjusted under 35 U.S.C. 154(b) by 777 days.

(21) Appl. No.: 09/912,184

(22) Filed: Jul. 24, 2001

(65) Prior Publication Data

US 2002/0016160 A1 Feb. 7, 2002

(30) Foreign Application Priority Data

Jul. 25, 2000 (JP) ......................................... 2000-223969

(51) Int. Cl.$^7$ ................................................ H03D 1/00
(52) U.S. Cl. ........................................... 327/50; 327/58
(58) Field of Search ............................. 327/50, 58, 62, 327/68–70, 77–79, 91, 94; 341/122, 123

(56) References Cited

U.S. PATENT DOCUMENTS

| | | | | |
|---|---|---|---|---|
| 4,112,381 A | * | 9/1978 | Mortensen et al. | 327/58 |
| 4,262,257 A | * | 4/1981 | Lawrence | 327/58 |
| 4,433,254 A | * | 2/1984 | Katakura et al. | 327/73 |
| 4,675,614 A | * | 6/1987 | Gehrke | 327/3 |
| 4,695,792 A | * | 9/1987 | Roy | 324/76.82 |
| 5,289,166 A | * | 2/1994 | Cohen | 340/661 |
| 5,498,955 A | * | 3/1996 | Fujii et al. | 324/76.77 |
| 5,808,462 A | * | 9/1998 | Fujii et al. | 324/76.13 |
| 5,922,964 A | | 7/1999 | Ishikawa et al. | |
| 5,949,257 A | | 9/1999 | Ishikawa | |
| 6,188,341 B1 | * | 2/2001 | Taniguchi et al. | 341/116 |

FOREIGN PATENT DOCUMENTS

| | | | |
|---|---|---|---|
| GB | 2066969 A | * | 7/1981 |
| JP | 61-266963 | | 11/1986 |
| JP | 01-311286 | | 12/1989 |
| JP | 10-009848 | | 1/1998 |

* cited by examiner

*Primary Examiner*—Timothy P. Callahan
*Assistant Examiner*—Hai L. Nguyen
(74) *Attorney, Agent, or Firm*—Rankin, Hill, Porter & Clark LLP

(57) ABSTRACT

Two all pass filters (11, 12) with 90° phase-shifted different center frequencies are employed to pass an alternating signal S with jitters in the period to generate signals S1 and S2, 90° phase-shifted from each other. A pulse generator (22) generates a sampling pulse Sp by detecting a zero cross point of the phase-shifted signal S2. A full-wave rectifier (21) rectifies full waves of the phase-shifted signal S1 and provides a rectified output to a sampling circuit (23), which extracts a peak value of the amplitude at the timing of the sampling pulse Sp.

10 Claims, 5 Drawing Sheets

AMPLITUDE-DETECTING METHOD AND CIRCUIT

BACKGROUND OF THE INVENTION

1. Field of the Invention

The present invention relates to an amplitude-detecting circuit usefully applicable in extraction of amplitude values from AC signals with jitters in the periods, such as detected signals from various instrumentation sensors, for example, a touch signal probe driven by a piezoelectric element, an electrostatic capacitance gap sensor, and the like.

2. Description of Related Art

As an instrumentation sensor for use in shape measurement of a mechanical structure, for example, a touch signal probe driven by a piezoelectric element is known as shown in FIG. 6. A stylus 71 has a spherical contact 73 attached at the tip and a balancer 74 at the rear end. A stylus holder 72 holds the stylus 71 approximately at the center of the length. A piezoelectric element 75 is attached approximately at the center of the stylus 71 to impart vibrations on the stylus 71. The piezoelectric element 75 has a vibrating electrode 75a to which a driving signal is applied from a driver 78 and a detecting electrode 75b from which a mechanical-electrical converted signal is detected by a detector 76. The detector 76 positively feeds an output signal back to the driver 78. This feedback control allows the piezoelectric element 75 to be excited in a resonance state at a certain frequency. The signal detected at the detecting electrode 75b is a sine wave alternating signal in the form of an amplitude-modulated carrier (vibrating signal), of which amplitude and frequency vary when the contact 73 touches a work to be measured. A signal processor 77 is employed to check the amplitude of the signal obtained from the detector 76 in order to detect the touch.

The detected signal from the touch signal probe contains jitters in the amplitude as well as in the period influenced from non-linearity of the piezoelectric element, interference among many vibration modes caused from a complicated structure, disturbances and so forth. The frequency of the detected signal is in the proximity of the frequency of the vibrating sinusiodal wave signal but fluctuates within a certain range below and above the vibrating frequency. This is disadvantageous when the amplitude of the detected signal must be detected fast or with no time delay, and with a high precision.

A well-known conventional sampling system with a constant sampling period can be employed to detect an amplitude peak value of the signal detected by the above touch signal probe. This sampling system is possible to perform a high accurate detection when the period of the detected signal is constant but causes errors in amplitude value detection in response to a period fluctuation of the detected signal when the period is not constant. In general, the detected value varies in response to a period of the vibrating frequency.

There is a method of rectifying full waves a detected signal then passing it through a low pass filter to remove ripples. This method is often employed to extract an amplitude value of an amplitude-modulated signal but has a large time delay on amplitude extraction due to a time constant of the low pass filter. Therefore, it can not be employed in a feedback control system for real-time constant-value controlling of an amplitude value that varies time to time.

Recently, in a remarkable digital processing system, all detected information is fast sampled, then A/D converted, and a mass digital data thus obtained is stored in a mass memory for later FFT analysis and filtering. Such the processing system can detect an amplitude value with high accuracy per period component of the detected signal while it is complicated and expensive. In addition, the FFT processing for the mass digital data requires a long time. Accordingly, the above processing system is effective only for an audio system and an instrumental system, of one-directional information transmission type, which are sufficient post-processing detected data. To the contrary, it is not applicable as such to an automatic control system that essentially requires a real time processing to feedback control the amplitude value varying in time to time as described above.

SUMMARY OF THE INVENTION

The present invention has been made in consideration of the above situation and accordingly has an object to provide a method and circuit capable of detecting an amplitude of an alternating signal in the form of a sine wave having fluctuations in a period and amplitude with a high accuracy and a slight time delay.

The present invention provides a method of detecting an amplitude of an alternating signal in the form of a sinusoidal wave having a period fluctuation within a certain fluctuant range together with an amplitude fluctuation. The method comprises preparing a first and a second all pass filters having phase shift characteristics set to cause a phase delay difference of 90° therebetween on signal transmission within a frequency range corresponding to the fluctuant range of the period; passing the alternating signal through the first and second all pass filters to generate a first and a second phase-shifted signals with a phase delay difference of 90° therebetween within the frequency range; and sampling an amplitude of one of the first and second phase-shifted signals at a timing when the other has a phase angle of a certain value.

The present invention also provides a circuit for detecting an amplitude of an alternating signal in the form of a sinusoidal wave having a period fluctuation within a certain fluctuant range together with an amplitude fluctuation. The circuit has a phase revising circuit including a first and a second all pass filters with 90° phase-shifted different frequencies for passing the alternating signal through the first and second all pass filters to generate a first and a second phase-shifted signals with a phase delay difference of 90° therebetween within a frequency range corresponding to the fluctuant range of the period; and a sampling circuit for sampling an amplitude of one of the first and second phase-shifted signals at a timing when the other has a phase angle of a certain value.

According to the present invention, an amplitude of an alternating signal can be detected at sampling timings variable in response to the period fluctuation of the alternating signal. Therefore, the detection of the amplitude value can be performed with a high accuracy and a slight time delay without affected from jitters on the period of the alternating signal.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings in which.

DETAILED DESCRIPTION OF THE EMBODIMENTS

Figure 1:
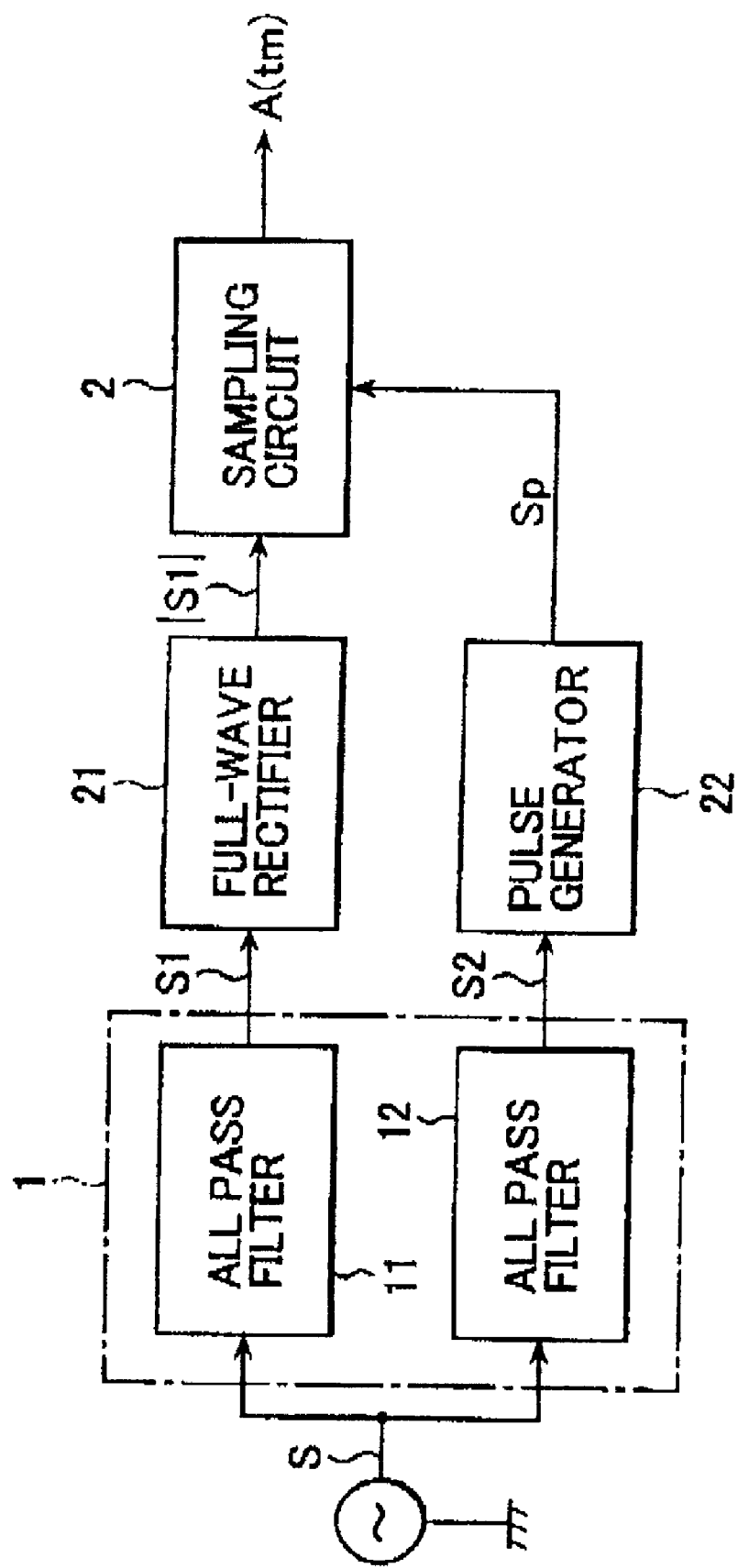
FIG. 1 is a block diagram showing an amplitude-detecting circuit according to an embodiment of the present invention.

The principle of amplitude detection according to the present invention is described prior to the description of embodiments. An alternating signal S, which is subjected to amplitude extracton, is represented with an amplitude A, period T and phase P by the following equation (1):

$$S = A\sin(2\pi t/T + P) \quad (1)$$

The AC signal of the equation (1) is passed through two all pass filters with different center frequencies for phase shifting. The center frequency is defined as a frequency at which 90° phase-shift is obtained. The two all pass filters are assumed to generate two phase-shifted signals S1 and S2 that have a phase difference of 90° therebetween within a frequency range corresponding to a fluctuant range of the periods of the AC signal S. The signals S1 and S2 are represented by the following equations (2) and (3):

$$S1 = A\sin(2\pi t/T + P - \epsilon(T)) \quad (2)$$

$$S2 = A\sin(2\pi t/T + P - \epsilon(T) - \pi/2) \quad (3)$$

The phase-shifted signal S1 has a phase delay of $\epsilon(T)$ and the phase-shifted signal S2 has a phase delay of $\epsilon(T)+\pi/2$. The above-described two all pass filters may employ primary 180° phase shifters. In this case, even if the period T of the AC signal S fluctuates about 10%, the phase difference between the two signals S1 and S2 can be maintained at 90° with a high precision.

The present invention utilizes the following fact with respect to the phase-shifted signals S1 and S2 obtained as the equations (2) and (3). Namely, the phase angle of the signal S2, $2\pi t/T+P-\epsilon(T)-\pi/2$, may become equal at a certain timing to a certain value, $m\pi+a$ (m denotes a positive integer). At this timing, the phase-shifted signals S1 and S2 are represented independent of the period T and the phase P by the following equations (4) and (5):

$$S1 = A\sin(\pi/2 + a) \quad (4)$$

$$S2 = A\sin(a) \quad (5)$$

If the phase-shifted signal S1 is sampled at a timing when the phase-shifted signal S2 has the above phase angle, the sampled value becomes like the signal S1 represented by the equation (4), from which the amplitude A can be immediately derived if the value of a is known. The amplitude value thus obtained does not depend on the period T as well as the phase P.

In particular, if a =0, then the sampling point comes to a point with zero amplitude (zero cross point) of the phase-shifted signal S2. Therefore, when a zero cross point on the phase-shifted signal S2 is detected to generate a sampling pulse, which is employed to sample the phase-shifted signal S1, amplitude detection can be achieved without affection of the period fluctuations.

FIG. 1 shows an amplitude-detecting circuit arrangement according to an embodiment of the present invention. An alternating signal S is an object to detect its amplitude. For example, it is a detected signal from an instrumental sensor such as a touch signal probe. The alternating signal S is a sine wave having a period fluctuation within a certain fluctuant range together with an amplitude fluctuation. A phase revising circuit 1 is provided to generate from the AC signal S two phase-shifted signals S1 and S2 with a phase difference of 90° from each other as indicated by the equations (2) and (3). The phase revising circuit 1 includes two all pass filters 11 and 12, of which input terminals are commonly connected.

Figure 2:
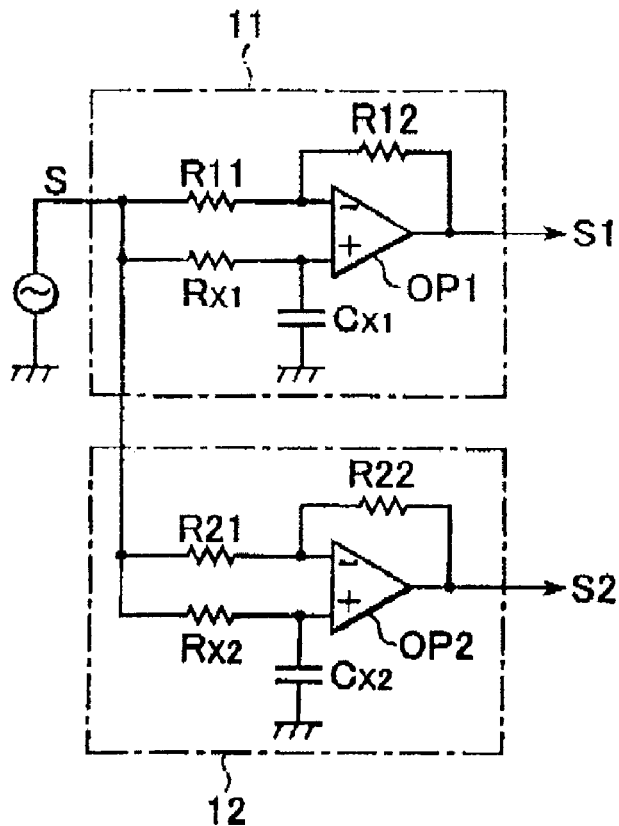
FIG. 2 is a circuit diagram showing all pass filters in the same embodiment.
Figure 3:
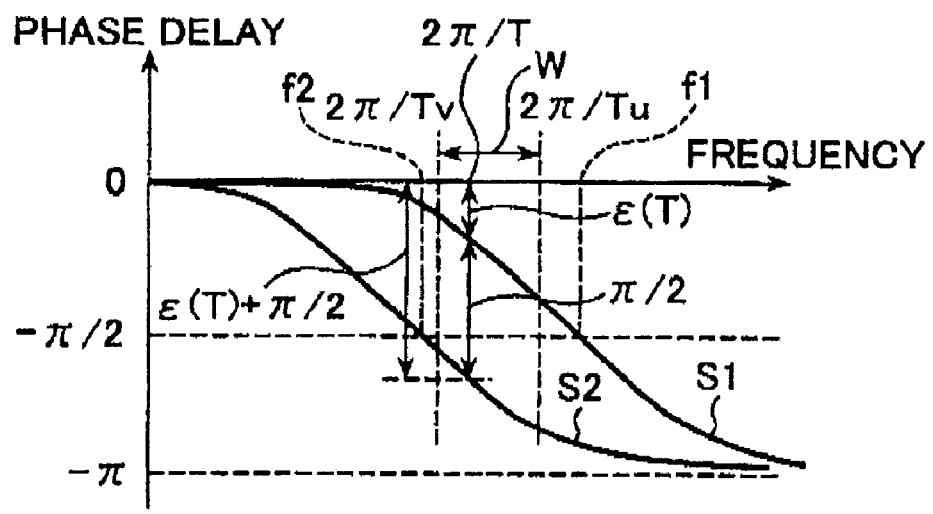
FIG. 3 shows phase-shift characteristics of the all pass filters.

The all pass filters 11, 12 are well-known primary phase shifters that have circuitry as shown in FIG. 2. The all pass filters 11, 12 configure 180° phase shifters that make a phase delay of 90° each at center frequencies f1, f2 by respectively setting of time constants, (R×1, C×1), (R×2, C×2). FIG. 3 shows the phase-shift characteristics. Waveforms passing through the all pass filters 11, 12 do not vary their amplitude within the whole frequency range and only exhibit simple phase delays in response to frequencies The AC signal S has a fundamental period of T and a fluctuant range of the period, between Tv and Tu. In a frequency range, w=2p/Tv to 2p/Tu, corresponding to the fluctuant range of the period, the signals S1 and S2 respectively have phase delays of $\epsilon(T)$ and $\epsilon(T)+\pi/2$. These phase delays has a difference of $\pi/2$ therebetween, which is constant if the frequency fluctuant range, w =2p/Tv to 2p/Tu, is contained between the center frequencies f1 and f2 of the two all pass filters 11 and 12. Namely, two accurately phase-shifted signals S1, S2 with a phase difference of just 90° can be obtained within the frequency fluctuant range.

For the two phase-shifted signals S1, S2 output from the all pass filters 11, 12, a sampling circuit 2 is provided to sample one of them, S1, at a timing when the other of them, S2, has a certain phase angle. Specifically in this embodiment, to generate a sampling pulse Sp based on the signal S2, a pulse generator 22 is provided to detect a zero cross point at which the signal S2 has zero amplitude. In addition, a full-wave rectifier 21 is employed to rectify the signal S1. The rectified output |S1| is supplied to the sampling circuit 2. Thus, amplitude peak values on each half-wave of the rectified output |S1| are sampled.

Figure 4:
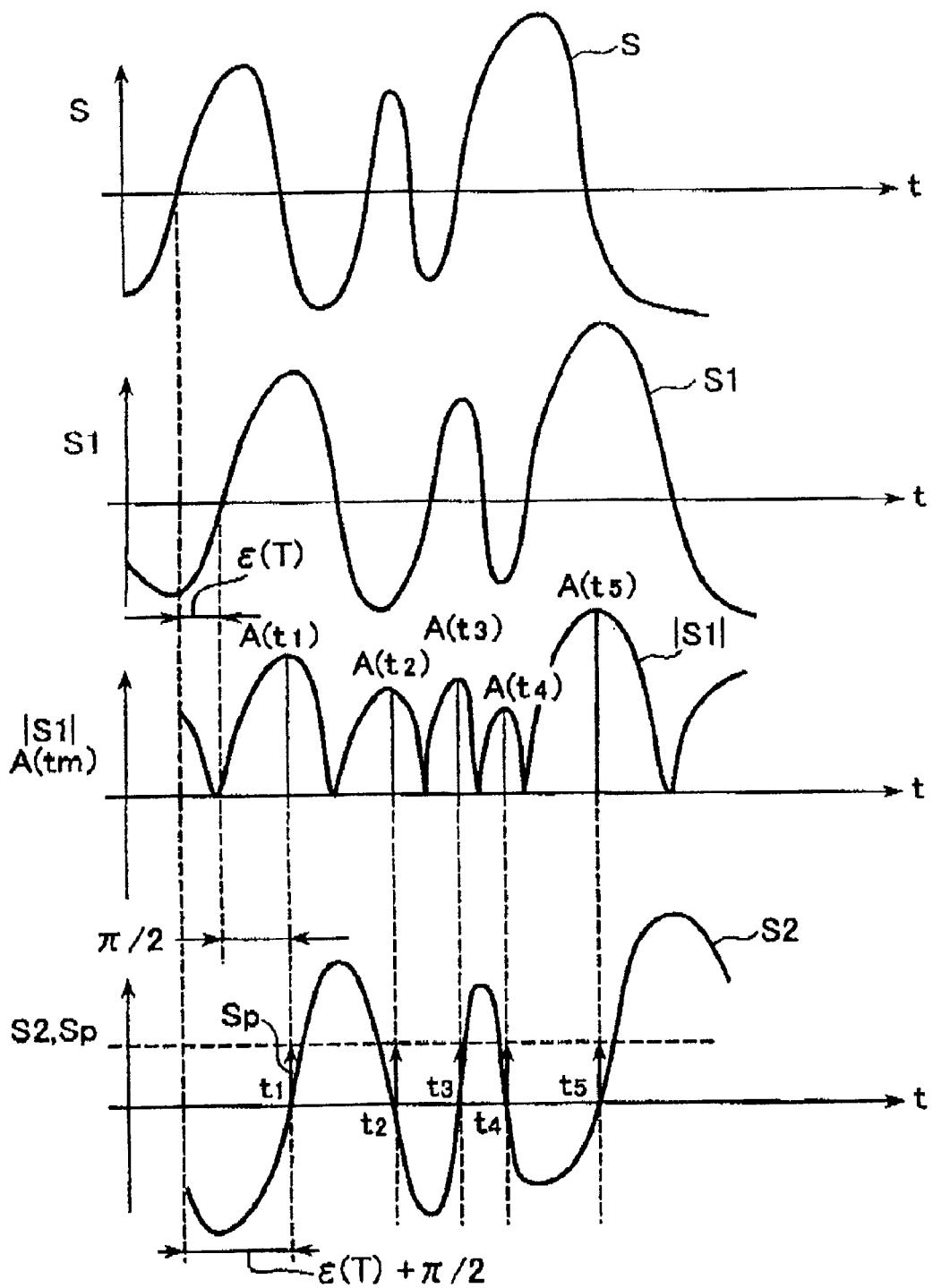
FIG. 4 shows operative waveforms of the amplitude-detecting circuit of FIG. 1.

FIG. 4 shows waveforms on various nodes in FIG. 1. The sampling pulses Sp are generated at zero cross timings of the signal S2, tm (m=1, 2, 3 . . . ), as indicated with each arrow. As shown, the sampling period varies in response to the period fluctuation of the signal S. Thus, each sampling pulse Sp is generated at each amplitude peak position of the signal S. As a result, the amplitude peak value A(tm) of the rectified output |S1|, that is, the amplitude A of the signal S1 at the point, a=0, in the equation (4) can be sampled.

The AC signal S has fluctuant period and amplitude. FIG. 4 shows waveforms with amplitude on the vertical axis and time on the horizontal axis. It can be found from FIG. 4 that the signals S1, S2 passed through the all pass filters 11, 12 are analogous to the original AC signal S but are not simply translated and rather distorted actually. Nevertheless, the relation shown in FIG. 3 can be satisfied. The phase delays, $\epsilon(T)$ and $\epsilon(T)+\pi/2$, indicated in FIG. 4 are converted values on the time axis.

In the embodiment described above, in contrast to the conventional constant-period sampling method, the sampling is performed at a variable time interval in response to the jitter on the period of the signal subjected to amplitude-detection. As a result, a time-to-time variable amplitude of an alternating signal that has a jitter on a period can be detected accurately with a simple processing circuit. A slight time delay is present in the amplitude-detection as obvious from FIG. 4. Therefore, the method is applicable without any problems to a control system for real-time feedback controlling of an amplitude value.

Figure 5:
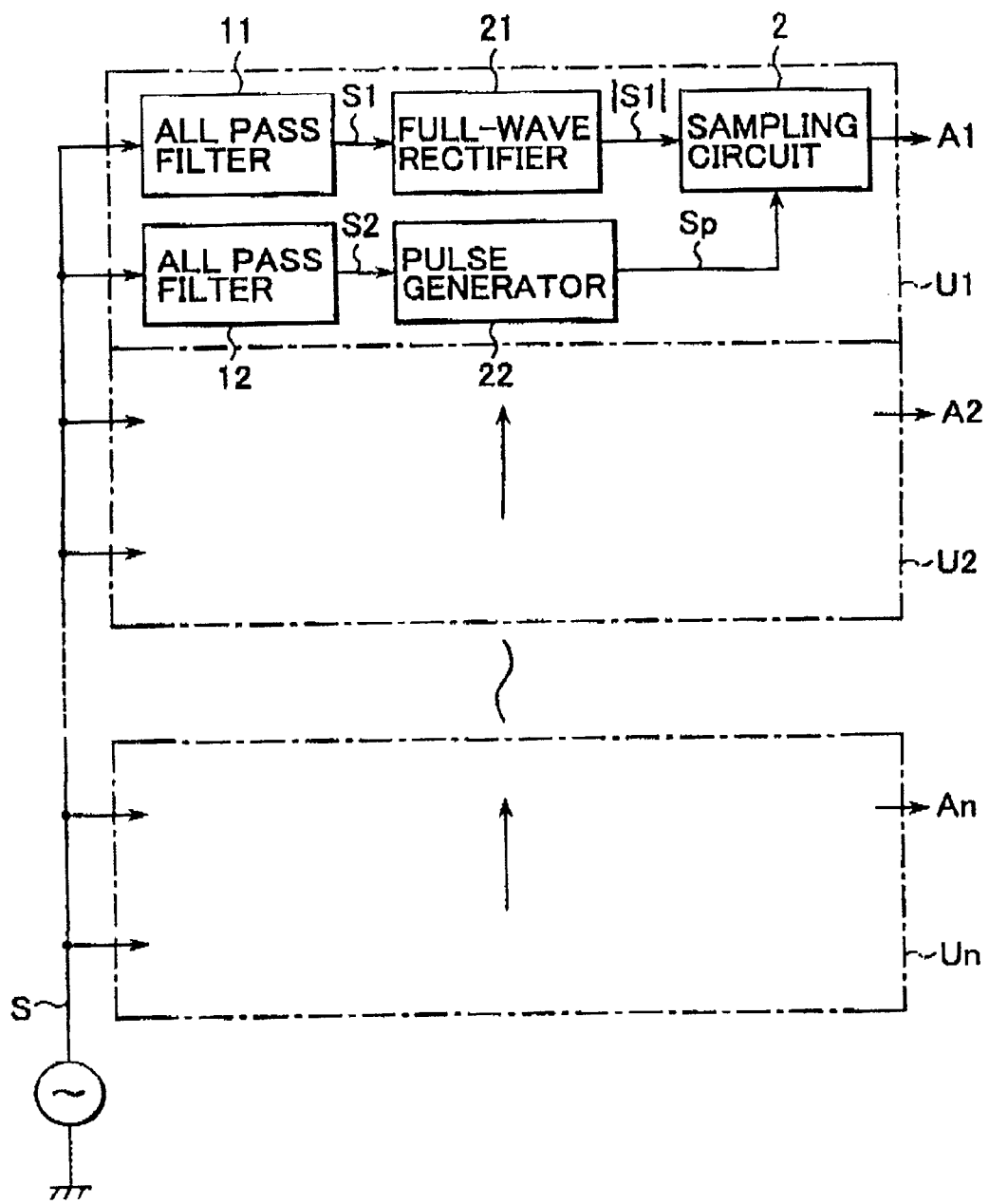
FIG. 5 is a block diagram showing an amplitude-detecting circuit according to another embodiment.
Figure 6:
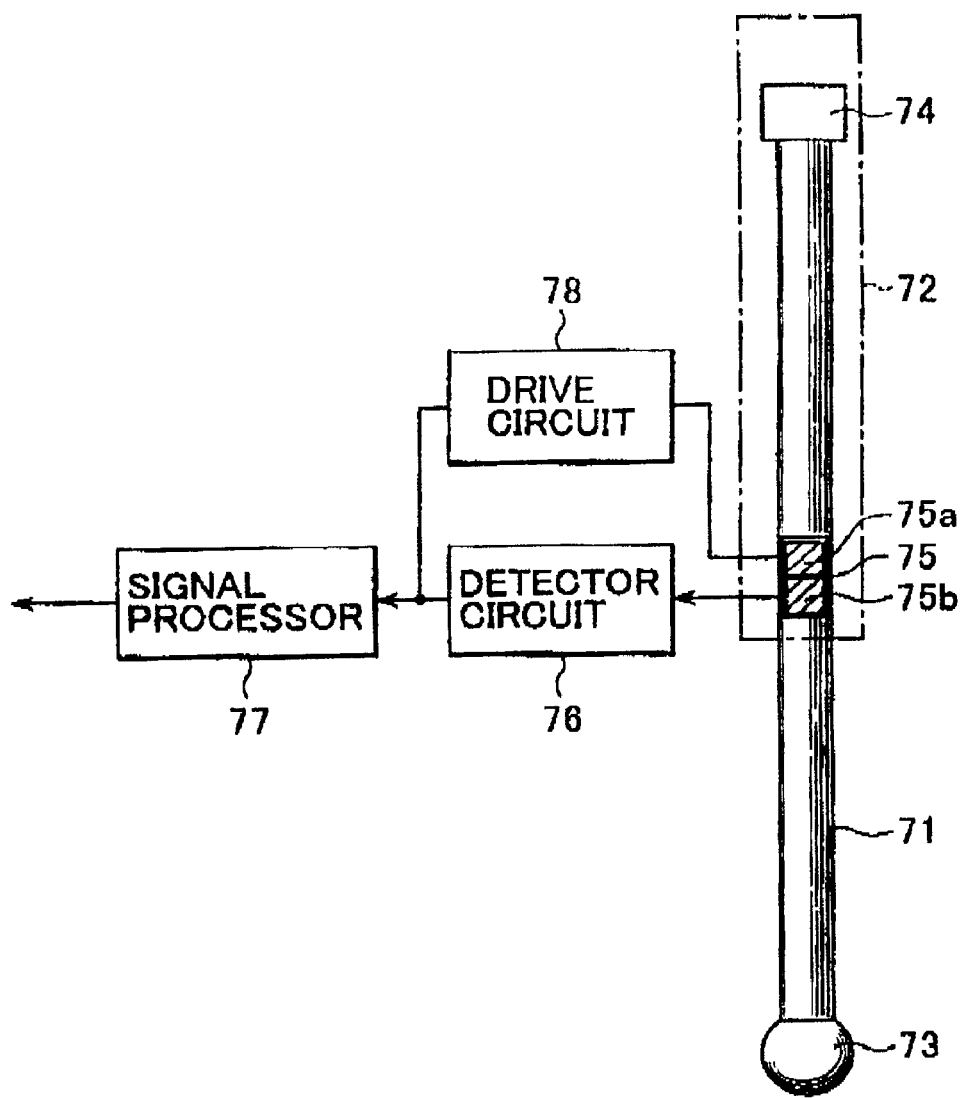
FIG. 6 shows an arrangement of a touch signal probe.

FIG. 5 shows another embodiment developed from the embodiment in FIG. 1. This embodiment provides a plurality of amplitude-detecting units U1, U2, . . . , Un in parallel (n denotes a positive integer), each including the whole amplitude-detecting circuit arrangement shown in FIG. 1.

These amplitude-detecting units are designed to have such relations that phase-shifted signals S1 output from the all pass filters 11 in the respective amplitude-detecting units have phase difference by $2\pi(=360°)/n$ from each other. Similarly, the phase-shifted signals S2 output from the all pass filters 12 in the respective amplitude-detecting units have phase difference by $2\pi/n$ from each other.

As a result, in the amplitude-detecting units U1, U2, . . . , Un, n amplitude values A1, A2 . . . , An are sampled within each period of the original AC signal S. Therefore, compared to the use of a single amplitude-detecting unit, amplitude values are sampled at $1/n$ sampling interval. When this arrangement is applied to the real-time feedback control system, a fast and high accurate amplitude-control can be achieved.

The circuit arrangements shown in FIG. 1 and FIG. 5 may be realized not only by analogue circuit simply but also by digital circuits easily. The AC signal S is A/D converted into digital data. Using a DSP (Digital Signal Processor) for all pass filtering and subsequent circuit processing, an amplitude value $A(tm)$ may be converted into digital value to output.

The present invention may be applied widely to other uses than the ultrasonic driven touch signal probe described above. For example, it may be applied to various instrumental sensors such as a micro-hole instrumental probe for providing a similar amplitude-modulated signal and an electrostatic capacitance gap sensor. It may also be applied to the use that requires extraction of variable amplitude values of an AC carrier with a swaying period such as wavelength control for a laser source.

As obvious from the forgoing, according to the present invention, an alternating signal subjected to amplitude-detection is passed through two all pass filters to obtain two phase-shifted signals with a high precise phase difference of 90°. Then, one of the phase-shifted signals is sampled at timing when the other has a certain phase value, thereby detecting an amplitude value without affected from jitters on periods of the alternating signal.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A circuit for detecting an amplitude of an alternating signal in the form of a sinusoidal wave having a period fluctuation within a certain fluctuant range together with an amplitude fluctuation, comprising:

a phase revising circuit including a first and a second all pass filters for changing said alternating signal to a first and a second phase-shifted signals with a phase delay difference of 90° therebetween within a frequency range corresponding to said fluctuant range of said period; and a sampling circuit for sampling an amplitude of one of said first and second phase-shifted signals at a timing when the other has a phase angle of a certain value.

2. The circuit according to claim 1, further comprising a pulse generator for detecting a zero cross point of said the other of first and second phase-shifted signals to generate a sampling pulse supplied at each zero cross point to said sampling circuit.

3. The circuit according to claim 1, further comprising:

a full-wave rectifier for rectifying full waves of said one of first and second phase-shifted signals to provide a rectified output to said sampling circuit; and a pulse generator for detecting a zero cross point of said the other of first and second phase-shifted signals to generate a sampling pulse supplied at each zero cross point to said sampling circuit.

4. The circuit according to claim 1, comprising n amplitude-detecting units, wherein each amplitude-detecting unit includes said phase revising circuit and said sampling circuit, the first phase-shifted signals in the respective amplitude-detecting units being different by a phase angle of 360°/n from each other, the second phase-shifted signals in the respective amplitude-detecting units being different by a phase angle of 360°/n from each other (n denotes a positive integer).

5. The circuit according to claim 1 wherein said alternating signal is an output signal from an instrumentation sensor.

6. A method of detecting an amplitude of an alternating signal in the form of a sinusoidal wave having a period fluctuation within a certain fluctuant range together with an amplitude fluctuation, comprising:

preparing a first and a second all pass filters having phase shift characteristics set to cause a phase delay difference of 90° therebetween on signal transmission within a frequency range corresponding to said fluctuant range of said period;

passing said alternating signal through said first and second all pass filters to generate a first and a second phase-shifted signals with a phase delay difference of 90° therebetween within said frequency range; and sampling an amplitude of one of said first and second phase-shifted signals at a timing when the other has a phase angle of a certain value.

7. The method according to claim 6, wherein said timing for sampling said amplitude of said one phase-shifted signal is determined as a phase angle of said the other phase-shifted signal when said the other phase-shifted signal has zero amplitude.

8. The method according to claim 6, wherein said alternating signal is an output signal from an instrumentation sensor.

9. The method according to claim 6, wherein said first and second all pass filters are the respective ones of n first and n second all pass filters prepared to generate n first and n second phase-shifted signals, respectively, he n first phase-shifted signals being different by a phase angle of 360°/n from each other, the n second phase-shifted signals being different by a phase angle of 360°/n from each other (n denotes a positive integer).

10. The method according to claim 9, comprising sampling an amplitude of each in one of n first and n second phase-shifted signals at a timing when the corresponding other phase-shifted signal has zero amplitude.

* * * * *

UNITED STATES PATENT AND TRADEMARK OFFICE
CERTIFICATE OF CORRECTION

PATENT NO. : 6,937,070 B2
DATED : August 30, 2005
INVENTOR(S) : Ishikawa et al.

It is certified that error appears in the above-identified patent and that said Letters Patent is hereby corrected as shown below:

Title page,
Item [57], ABSTRACT,
Line 3, after "signals", insert -- , --.

Column 6,
Line 57, delete "he" and insert -- the --.

Signed and Sealed this

Eighth Day of November, 2005

JON W. DUDAS
*Director of the United States Patent and Trademark Office*